United States Patent
Yamane et al.

(10) Patent No.: US 9,159,726 B2
(45) Date of Patent: Oct. 13, 2015

(54) SEMICONDUCTOR MEMORY DEVICE AND METHOD FOR MANUFACTURING SAME

(71) Applicant: Kabushiki Kaisha Toshiba, Minato-ku (JP)

(72) Inventors: Osamu Yamane, Kanagawa-ken (JP); Yoshihiro Yanai, Mie-ken (JP); Hiromitsu Mashita, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/202,088

(22) Filed: Mar. 10, 2014

(65) Prior Publication Data

US 2015/0069568 A1    Mar. 12, 2015

Related U.S. Application Data

(60) Provisional application No. 61/875,756, filed on Sep. 10, 2013.

(51) Int. Cl.

| | |
|---|---|
| *H01L 29/94* | (2006.01) |
| *H01L 31/062* | (2012.01) |
| *H01L 31/113* | (2006.01) |
| *H01L 21/335* | (2006.01) |
| *H01L 21/337* | (2006.01) |
| *H01L 21/8238* | (2006.01) |
| *H01L 27/10* | (2006.01) |

(52) U.S. Cl.
CPC ..................................... *H01L 27/10* (2013.01)

(58) Field of Classification Search
CPC ............ H01L 27/2454; H01L 27/0688; H01L 27/0705; H01L 27/11578
USPC ................. 257/211, 250, 329, 331, 341, 401; 438/142, 157, 192, 195, 212
See application file for complete search history.

(56) References Cited

U.S. PATENT DOCUMENTS

| | | | |
|---|---|---|---|
| 6,403,413 B2 | 6/2002 | Hayano et al. | |
| 8,288,812 B2 | 10/2012 | Kai et al. | |
| 8,294,191 B2 | 10/2012 | Katsumata et al. | |
| 8,633,535 B2 * | 1/2014 | Matsuo et al. | 257/324 |
| 8,797,777 B2 * | 8/2014 | Hishida et al. | 365/51 |
| 2012/0070985 A1 | 3/2012 | Hashimoto et al. | |
| 2012/0319173 A1 * | 12/2012 | Ko et al. | 257/211 |
| 2012/0320652 A1 * | 12/2012 | Kono | 365/63 |

FOREIGN PATENT DOCUMENTS

JP     2009-123328     6/2009

* cited by examiner

*Primary Examiner* — Hsien Ming Lee
(74) *Attorney, Agent, or Firm* — Oblon, McClelland, Maier & Neustadt, L.L.P.

(57) ABSTRACT

According to one embodiment, a semiconductor memory device includes a semiconductor substrate and a memory array. The semiconductor substrate has a first face. The memory array region is provided on the first face and includes a plurality of semiconductor pillars. The semiconductor pillars extend in a first direction perpendicular to the first face. Each of the semiconductor pillars includes a plurality of memory cells connected in series. Each of the semiconductor pillars is disposed at the nodes of a honeycomb shape when viewed in the first direction. When the semiconductor pillars are projected onto a first plane along the first and second directions perpendicular to the first direction, a component in the second direction of an interval between the semiconductor pillars has first and second intervals repeated alternately. The second interval is an integer multiple of the first interval greater than or equal to 2.

8 Claims, 13 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/875,756 filed on Sep. 10, 2013; the entire contents of which are incorporated herein by reference.

FIELD

Embodiments described herein relate generally to a semiconductor memory device and a method for manufacturing the same.

BACKGROUND

In recent years, semiconductor memory devices with increased density by arranging the memory cells in 3-dimensions have been proposed. This semiconductor device includes a plurality of pillar-shaped semiconductor pillars. Each semiconductor pillar includes a plurality of memory cells connected in series. Each semiconductor pillar is provided penetrating a stacked body that includes a plurality of electrode films stacked on a semiconductor substrate. The memory cells are configured at the positions where each semiconductor pillar intersects the plurality of electrode films. A plurality of bit lines and a plurality of source lines connected to each semiconductor pillar is provided in the semiconductor memory device. In the semiconductor memory device, it is important to increase the density of memory cells, as well as to reduce the pitch of the interconnection of the bit lines, and the like.

DETAILED DESCRIPTION

Figure 1:
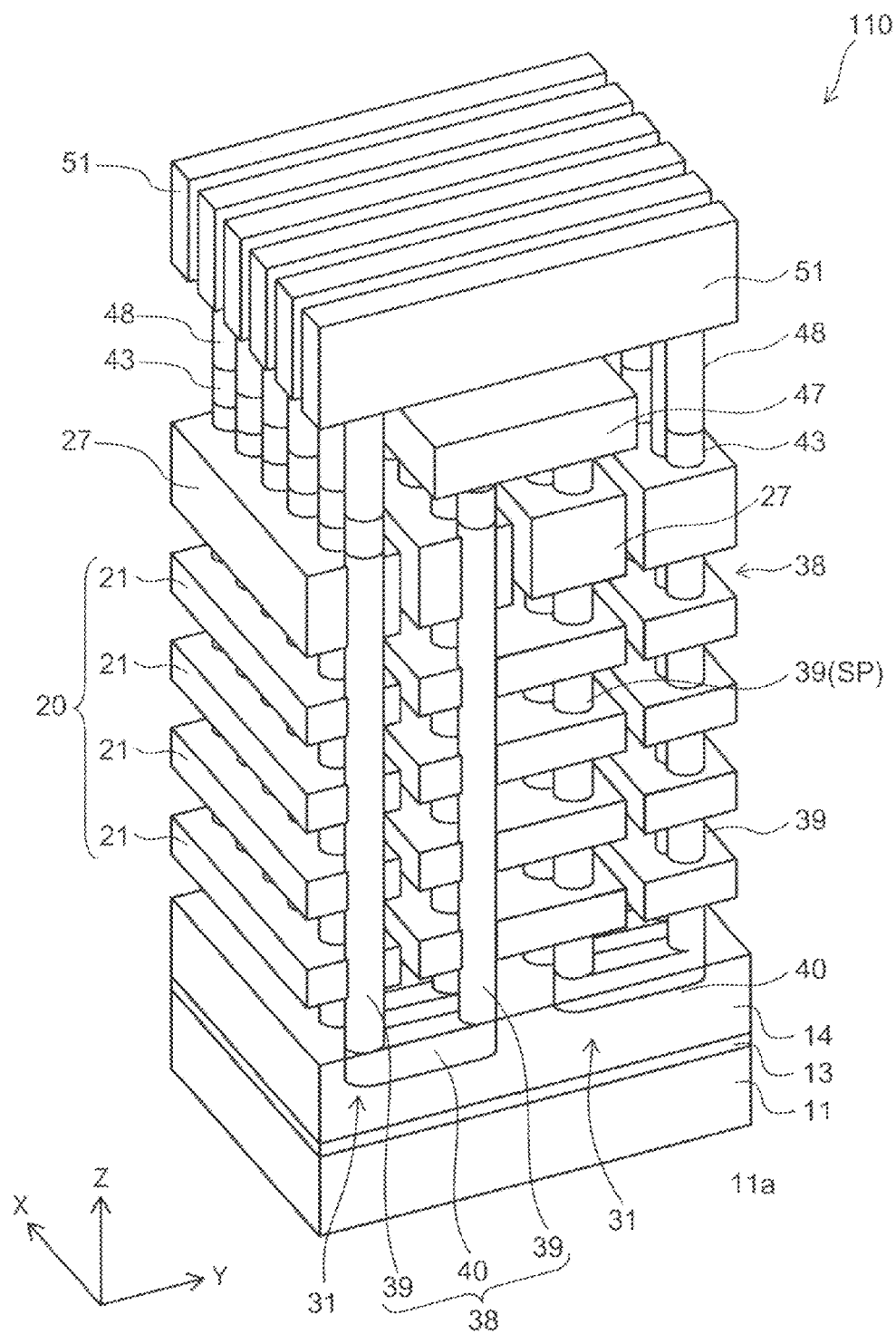
FIG. 1 is a schematic perspective view illustrating a configuration of a semiconductor memory device according to a first embodiment.

In general, according to one embodiment, a semiconductor memory device includes a semiconductor substrate and a memory array. The semiconductor substrate has a first face. The memory array region is provided on the first face of the first semiconductor substrate. The memory array includes a plurality of semiconductor pillars. The semiconductor pillars extend in a first direction perpendicular to the first face. Each of the semiconductor pillars includes a plurality of memory cells connected in series. Each of the semiconductor pillars is disposed at the nodes of a honeycomb shape when viewed in the first direction. When the semiconductor pillars are projected onto a first plane along the first direction and a second direction perpendicular to the first direction, a component in the second direction of an interval between the semiconductor pillars having a first interval and a second interval repeated alternately, the second interval being an integer multiple of the first interval greater than or equal to 2.

Various embodiments will be described hereinafter with reference to the accompanying drawings. In the following description, the same reference numeral is applied to the same member, and for members that have been described once, the description is omitted as appropriate.

(First Embodiment)

FIG. 1 is a schematic perspective view illustrating a configuration of a semiconductor memory device according to a first embodiment.

Figure 2:
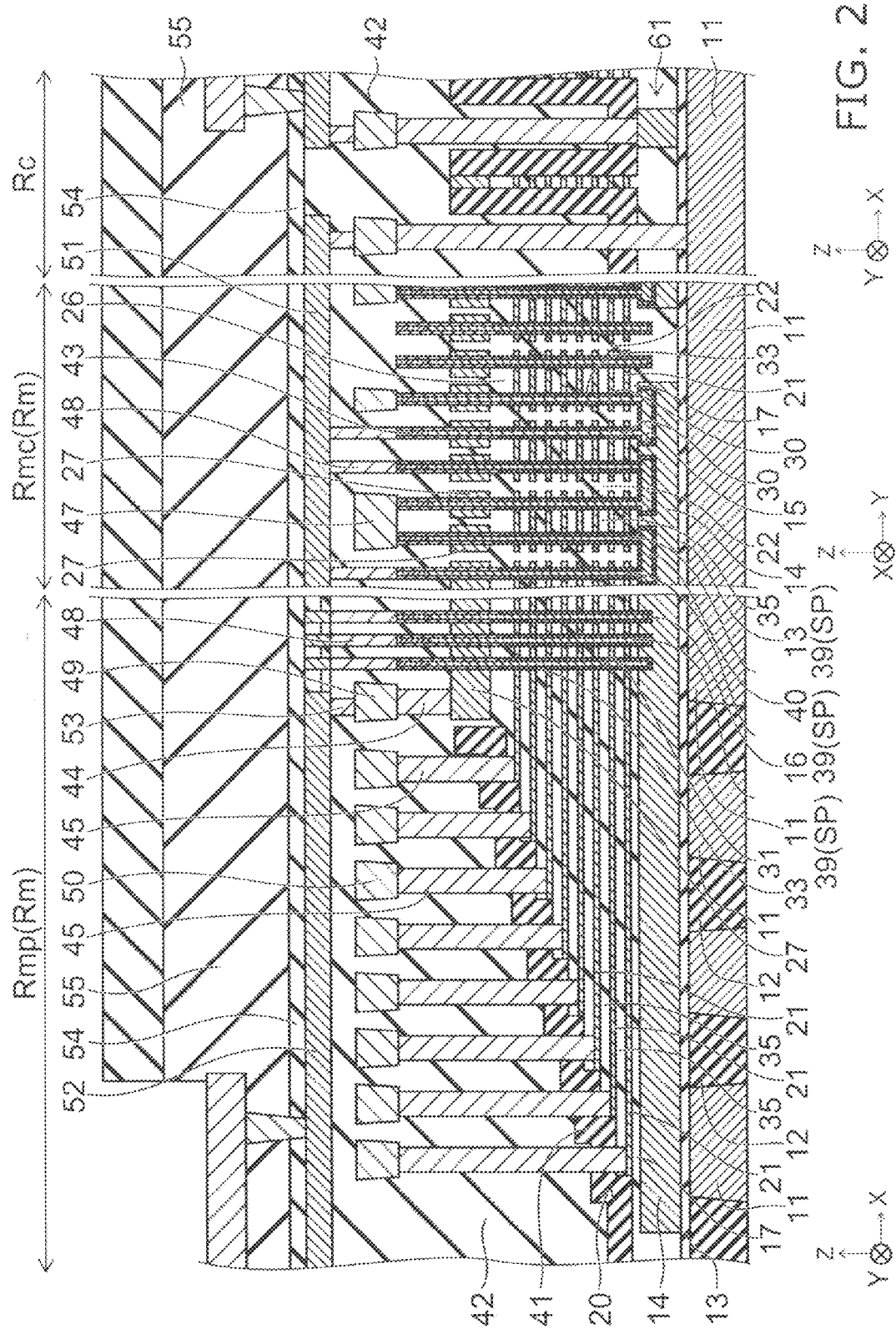
FIG. 2 is a schematic cross-sectional view illustrating the configuration of the semiconductor memory device according to the first embodiment.

FIG. 2 is a schematic cross-sectional view illustrating the configuration of the semiconductor memory device according to the first embodiment.

FIG. 2 illustrates an end portion of a memory array region, a central portion of the memory array region, and a surrounding circuit region.

Figure 3:
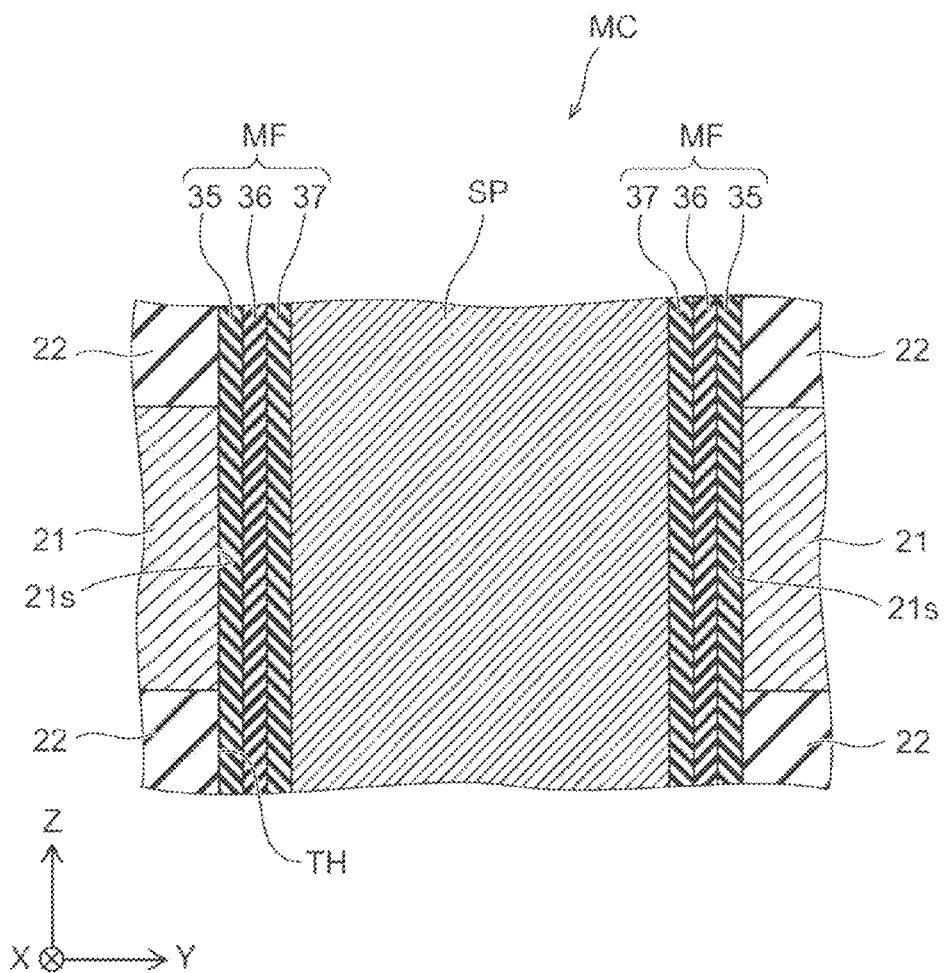
FIG. 3 is a schematic cross-sectional view illustrating the configuration of a portion of the semiconductor memory device according to the first embodiment.

FIG. 3 is a schematic cross-sectional view illustrating the configuration of a portion of the semiconductor memory device according to the first embodiment.

FIG. 3 illustrates a portion of the electrode films and the memory films.

First, a semiconductor memory device 110 according to this embodiment will be described.

As shown in FIG. 1 to FIG. 3, the semiconductor memory device 110 includes a plurality of electrode films 21 provided on a substrate 11, a semiconductor layer 39, and a memory film 33. The semiconductor memory device 110 is, for example, a nonvolatile memory device.

In this patent specification, an axis perpendicular to a first face 11a of the substrate 11 is a Z axis (first axis), one of the axes perpendicular to the Z axis is an X axis (second axis), and another one of the axes perpendicular to the Z axis, that is also perpendicular to the X axis (second axis) is a Y axis (third axis). The direction along the Z axis is the Z direction. The direction along the X axis is the X direction. The direction along the Y axis is the Y direction.

Also, the direction along the Z axis away from the first face 11a of the substrate 11 is referred to as up (upwards), and the opposite direction is referred to as down (downwards).

The plurality of electrode films 21 is stacked along the Z axis. In this specific example, four electrode films 21 are stacked along the Z axis at a specific interval, as an example. In this embodiment, an example is described having four electrode films 21 for convenience of explanation, but cases in which the number of electrode films 21 is different from four are similar.

The semiconductor layer 39 is opposite a side face 21s of the plurality of electrode films 21. The semiconductor layer 39 is, for example, a pillar-shaped semiconductor pillar SP provided along the Z axis. The semiconductor pillar SP is, for example, a solid structure made from a semiconductor material. The semiconductor pillar SP may also be a hollow structure made from a semiconductor material. An insulating layer, for example, may be provided on the inside of the hollow structure of the semiconductor pillar SP.

The memory film 33 is provided between each of the side faces 21s of the plurality of electrode films 21 and the semiconductor layer 39. A memory cell transistor is formed by the memory film 33 provided at a position where the side face 21s of the electrode film 21 and the semiconductor layer 39 intersect. Memory cell transistors are arranged in a three-dimensional matrix form, and by accumulating charge in a memory layer (charge storage film 36), each memory cell transistor functions as a memory cell MC that stores information (data).

The semiconductor layer 39 is included in the semiconductor pillar SP that extends along the Z axis. In the semiconductor memory device 110, a U-shaped memory string is configured from two semiconductor pillars SP adjacent to each other along the Y axis, and a connecting member 40 that connects end portions of the two semiconductor pillars. A plurality of memory strings is arranged on the substrate 11.

Silicon, for example, is used in the substrate 11. In this embodiment, an example of the use of a silicon substrate 11 is described as an example.

As shown in FIG. 2, in a memory array region Rm, a silicon oxide film 13 is formed on the substrate 11, and a back gate electrode 14 made from a conductive material such as, for example, silicon doped with phosphorus (phosphorus doped silicon) is provided on the silicon oxide film 13.

In the central portion Rmc of the memory array region Rm, a plurality of concave portions 15 extending in the Y axis direction is formed in an upper layer portion of the back gate electrode 14. A silicon oxide film 16, for example, is provided on the inner faces of the concave portions 15. Also, a silicon oxide film 17 is provided on the back gate electrode 14.

A stacked body 20 is provided on the silicon oxide film 17. The plurality of electrode films 21 is provided in the stacked body 20. For example, silicon into which boron is introduced (boron doped silicon) is used in the electrode films 21. The electrode films 21 function as gate electrodes of the memory cell transistor. The shape of the electrode films 21 is band shaped extending in the X axis, and arranged in a matrix along the Y axis and the Z axis.

In the end portion Rmp of the memory array region Rm, the plurality of electrode films 21 is processed in a stairs form.

An insulating member 22 made from, for example, silicon oxide, is provided between the electrode films 21 adjacent to each other along the Y axis. The insulating member 22 has a shape that penetrates the stacked body 20.

A silicon oxide film 26 is provided on the stacked body 20. A control electrode 27 is provided on the silicon oxide film 26. For example, boron doped silicon is used in the control electrode 27. The control electrode 27 extends along the X axis. The control electrode 27 is provided in each semiconductor pillar SP.

A plurality of through holes 30 is formed extending along the Z axis in the stacked body 20, the silicon oxide film 26, and the control electrode 27. The through holes 30 pass through the control electrode 27, the silicon oxide film 26, and the stacked body 20, and reach both ends of the concave portions 15 along the Y axis. In this way, pairs of through holes 30 adjacent to each other along the Y axis are linked by the concave portions 15, and constitute a single U-shaped hole 31. The shape of each through hole 30 is, for example, a circular cylindrical shape. The shape of each U-shaped hole 31 is generally U-shaped.

Figure 4:
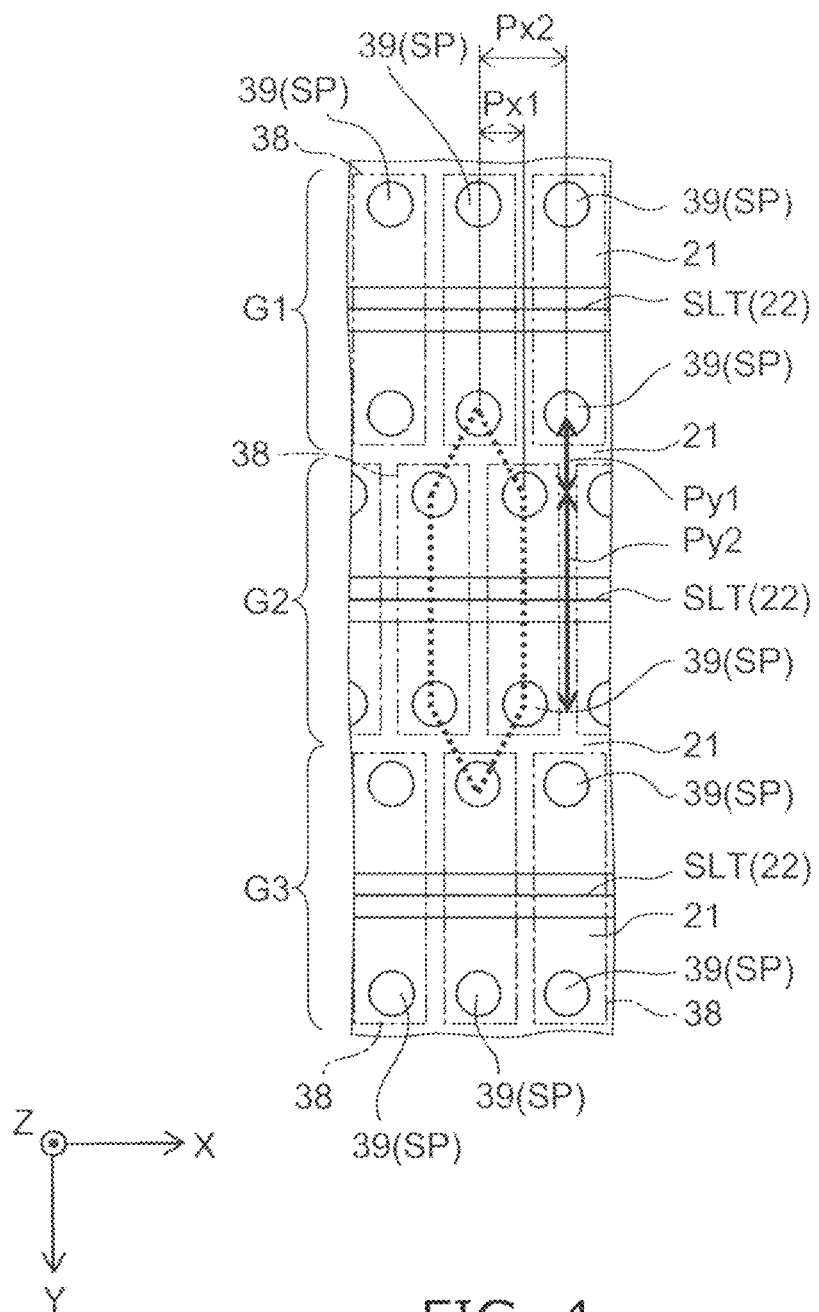
FIG. 4 is a schematic plan view illustrating the layout of the semiconductor pillars.

As shown in FIG. 4, the semiconductor pillar SP is opposite to the side face 21s of the electrode films 21. Also, the memory film 33 is provided between the electrode films 21 and semiconductor pillar SP. The memory film 33 is provided around the semiconductor pillar SP so as to enclose it along the Z axis. In the memory film 33, memory cell transistors are formed at the portions where the electrode films 21 and the semiconductor pillars SP intersect, and each of the memory cell transistors forms a memory cell MC.

The memory film 33 includes an external insulating film 35 (first insulating film), a memory layer 36 (second insulating film), and an internal insulating film 37 (third insulating film). The external insulating film 35 is provided between the memory layer 36 and an electrode film 61. The internal insulating film 37 is provided between the memory layer 36 and the semiconductor pillar SP. In other words, in the through hole TH, the memory film 33 includes the external insulating film 35, the memory layer 36, and the internal insulating film 37 stacked in that order in the direction from the electrode film 21 toward the semiconductor pillar SP.

For example, a material that includes an oxide (silicon oxide or the like) is used in the external insulating film 35 and the internal insulating film 37. For example, the material that includes a nitride (silicon nitride or like) is used in the memory layer 36. The external insulating film 35, the memory layer 36, and the internal insulating film 37 may each be single layer films, or they may be stacked films. Also, the materials are not limited to the above, and any material can be used.

In the memory cell MC, the memory layer 36 functions as the information storage portion, by accumulating or discharging charge as a result of an electric field applied between the semiconductor pillar SP and the electrode film 21. In other words, the memory layer 36 functions as a charge storage layer.

The internal insulating film 37 functions as a tunnel insulating film in each memory cell MC. The external insulating film 35 functions as a block insulating film in each memory cell MC.

The semiconductor layer 39 is embedded within the U-shaped hole 31. Polysilicon that includes an impurity (for example, phosphorus) is used in the semiconductor layer 39. A U-shaped pillar 38 is formed by embedding the semiconductor layer 39 within the U-shaped hole 31. The shape of the U-shaped pillar 38 is a U-shape that reflects the shape of the U-shaped hole 31.

The U-shaped pillar 38 contacts the internal insulating film 37. Within the U-shaped pillar 38, the portions disposed within the through holes 30 are the semiconductor pillars SP, and the portion disposed within the concave portion 15 is the connecting member 40.

Of the plurality of semiconductor pillars SP, the semiconductor pillars SP aligned along the X axis in the same row pass through the same electrode films 21. In the four semiconductor pillars SP1 to SP4 included in two adjacent U-shaped pillars 38, the inside two semiconductor pillars SP2 and SP3 pass through the same electrode films 21. Also, in the above-described four semiconductor pillars SP1 to SP4, the outside two semiconductor pillars SP1 and SP4 pass through the same electrode films 21. Each semiconductor pillar SP may be provided so as to pass through different electrode films 21.

As shown in FIG. 2, in the end portion Rmp of the memory array region Rm, a silicon nitride film 41 is provided on the side face of the stacked body 20 processed in a stairs form, on the side face of the silicon oxide film 26, and on the side face of the control electrode 27. The silicon nitride film 41 is formed in a stairs form that reflects the shape of the end portion of the stacked body 20. Also, an interlayer insulating film 42 made from, for example, silicon oxide is provided on the control electrode 27 and on the silicon nitride film 41, embedding the stacked body 20.

A plug 43, and contacts 44 and 45 are embedded in the interlayer insulating film 42. The plug 43 is disposed in the region directly above the semiconductor pillar SP, and is connected to the semiconductor pillar SP. The contact 44 is disposed in the region directly above a first end portion of the control electrode 27 along the X axis, and is connected to the control electrode 27. The contact 45 is disposed in a region directly above a first end portion of the electrode film 21 along the X axis, and is connected to the electrode film 21.

A source line 47, a plug 48, and interconnections 49 and 50 are embedded in the interlayer insulating film 42 in a portion above the plug 43 and the contacts 44 and 45. The source line 47 extends along the X axis, and is connected via the plug 43 to one of the pair of semiconductor pillars SP belonging to the U-shaped pillar 38. The plug 48 is connected via the plug 43 to the other of the pair of semiconductor pillars SP belonging to the U-shaped pillar 38. The interconnections 49 and 50 extend along the Y axis, and are connected to the contacts 44 and 45, respectively.

A bit line 51 extending along the Y axis is provided on the interlayer insulating film 42, and connected to the plug 48. Also, interconnection 52 is provided on the interlayer insulating film 42, and is connected to the interconnection 49 via a plug 53. A silicon nitride film 54 and an interlayer insulating film 55 are provided on the interlayer insulating film 42 so as to embed the bit line 51 and the interconnection 52, embedding specific interconnection and the like.

As shown in FIG. 2, in a peripheral circuit region Rc, a transistor 61 and the like are formed on an upper layer portion of the substrate 11. The interlayer insulating film 42, the silicon nitride film 54, and the interlayer insulating film 55 are provided on the substrate 11. Specific interconnection and the like is embedded within the peripheral circuit region Rc.

FIG. 4 is a schematic plan view illustrating the layout of the semiconductor pillars.

In FIG. 4, the layout of a top end portion of the plurality of semiconductor pillars SP when viewed from the Z direction is illustrated. For convenience of explanation, the plurality of semiconductor pillars SP, the electrode films 21, and the insulating members 22 embedded in a slit SLT are shown in FIG. 4.

In the semiconductor memory device 110 according to this embodiment, each of the plurality of semiconductor pillars SP is disposed at the nodes of a honeycomb shape when viewed from the Z direction.

The two semiconductor pillars SP included in the U-shaped pillar 38 are disposed in the same position in the X direction. In other words, the line connecting each of the top end portions of the two semiconductor pillars SP is along the Y axis.

The plurality of U-shaped pillars 38 is disposed at constant intervals Px in the X direction. In other words, each of the top end portions of the two semiconductor pillars SP adjacent to each other in the X direction is disposed at constant intervals Px in the X direction.

Here, groups of the plurality of U-shaped pillars 38 aligned in the X direction are referred to as pillar groups. In two pillar groups adjacent in the Y axis, the positions in the X direction of the semiconductor pillars SP are disposed separated from each other by a half pitch. In this way, a disposition of the semiconductor pillars SP disposed at the nodes of a hexagonal shape of a honeycomb shape is configured by the four semiconductor pillars SP included in two adjacent U-shaped pillars 38 in one pillar group (for example, a second pillar group G2), the semiconductor pillar SP included in the U-shaped pillar 38 of one of the pillar group (for example, the first pillar group G1) adjacent to the two U-shaped pillars 38, and the semiconductor pillar SP included in the U-shaped pillar 38 of the other of the pillar group (for example, a third pillar group G3).

In the semiconductor memory device 110 according to this embodiment, when the plurality of semiconductor pillars SP is projected onto the ZX plane, the interval Px1 in the X direction is constant. The interval Px1 is ½ the interval Px. In addition, in the semiconductor memory device 110 according to this embodiment, when the plurality of semiconductor pillars SP is projected onto the ZY plane, the intervals in the Y direction are a first interval Py1 and a second interval Py2 repeating alternately. The second interval Py2 is double the first interval Py1. The second interval may be an integer multiple of the first interval Py1 greater than or equal to 2. In this embodiment, an example in which the multiple is 2 is described for which the density of the memory cell MC is the maximum.

Of the six semiconductor pillars SP disposed at each of the nodes of one hexagonal shape, the component in the Y direction of the interval of the two semiconductor pillars SP included in the U-shaped pillars 38 is the second interval Py2. Of the six semiconductor pillars SP disposed at each of the nodes of one hexagonal shape, the component in the Y direction of the interval of the two semiconductor pillars SP included in mutually different U-shaped pillars 38 is the first interval Py1.

The insulating member 22 embedded in the slit SLT is interposed between the two semiconductor pillars SP included in a U-shaped pillar 38. If the slit SLT and the insulating member 22 are not provided, a voltage is applied to all the memory cells in a specific layer. In other words, unnecessary voltage would be repeatedly applied to the memory cells, resulting in a reduction in the reliability of the device.

Therefore, the interval of the two semiconductor pillars SP included in the U-shaped pillar 38 is the second interval Py2 wider than the first interval Py1. In this way, it is possible to properly provide the slit SLT and the insulating member 22 between the two semiconductor pillars SP.

As a result of this layout of the plurality of semiconductor pillars SP, it is possible to provide the plurality of interconnections to activate each of the semiconductor pillars SP in a linear manner. In addition, the pitch of the plurality of interconnection is narrower compared with the case in which the plurality of semiconductor pillars SP is lay out in a simple matrix form.

Figure 5:
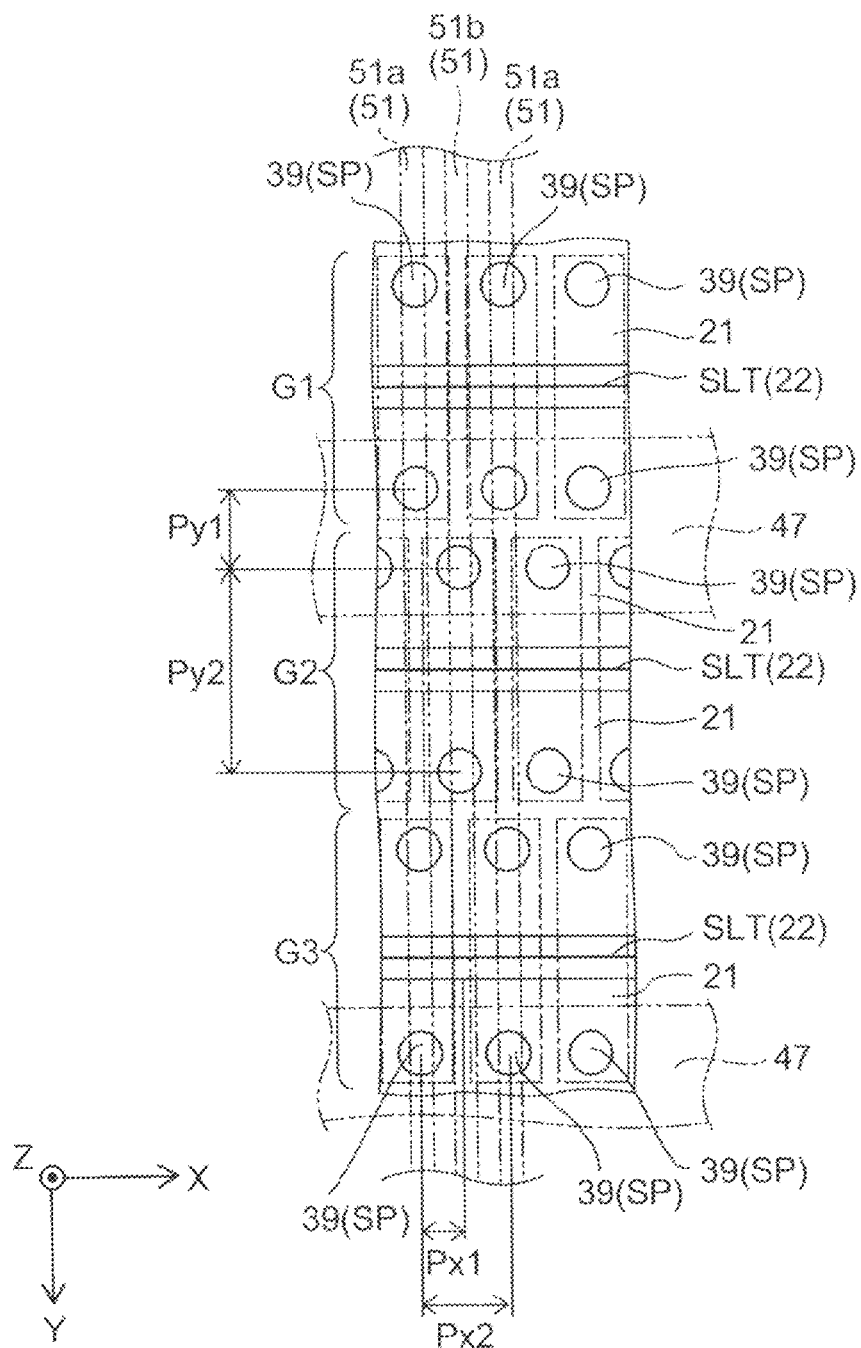
FIG. 5 is a schematic plan view illustrating the layout of the interconnection.

FIG. 5 is a schematic plan view illustrating the layout of the interconnection.

FIG. 5 schematically illustrates a portion of the bit line 51 and a portion of the source line 47 when viewed from the Z direction. For convenience of explanation, the plurality of semiconductor pillars SP, the electrode films 21, the insulating members 22 embedded in the slit SLT, the bit lines 51, and the source lines 47 are shown in FIG. 5.

As shown in FIG. 5, the plurality of bit lines 51 extends in the Y direction. The plurality of bit lines 51 is provided in a linear manner in the Y direction. The interval in the X direction of the plurality of bit lines 51 is the interval Px1. In the semiconductor memory device 110 according to this embodiment, the plurality of semiconductor pillars SP is disposed at the nodes of a honeycomb shape, when viewed from the Z direction. The shortest component in the X direction of the interval of the plurality of semiconductor pillars SP is the interval Px1, so the interval in the X direction of the plurality of bit lines 51 is also the interval Px1.

Among the plurality of bit lines 51, a bit line 51a activates the semiconductor pillars SP of the first pillar group G1 and the third pillar group G3. Also, among the plurality of bit lines 51, a bit line 51b adjacent to the bit line 51a activates the semiconductor pillars SP of the second pillar group G2.

Also, the plurality of source lines 47 extends in a direction (X direction) perpendicular to the plurality of bit lines 51. The source lines 47 are provided between pillar groups adjacent to each other in the Y direction, when viewed from the Z direction. For example, the source line 47 activates adjacent semiconductor pillars SP between the first pillar group G1 and the second pillar group G2.

With the semiconductor memory device 110 according to this embodiment, it is possible to increase the density of the memory cells MC, as well as to reduce the interval of the plurality of bit lines 51.

(Second Embodiment)

Next, a method for manufacturing a semiconductor memory device according to a second embodiment will be described.

Figure 6:
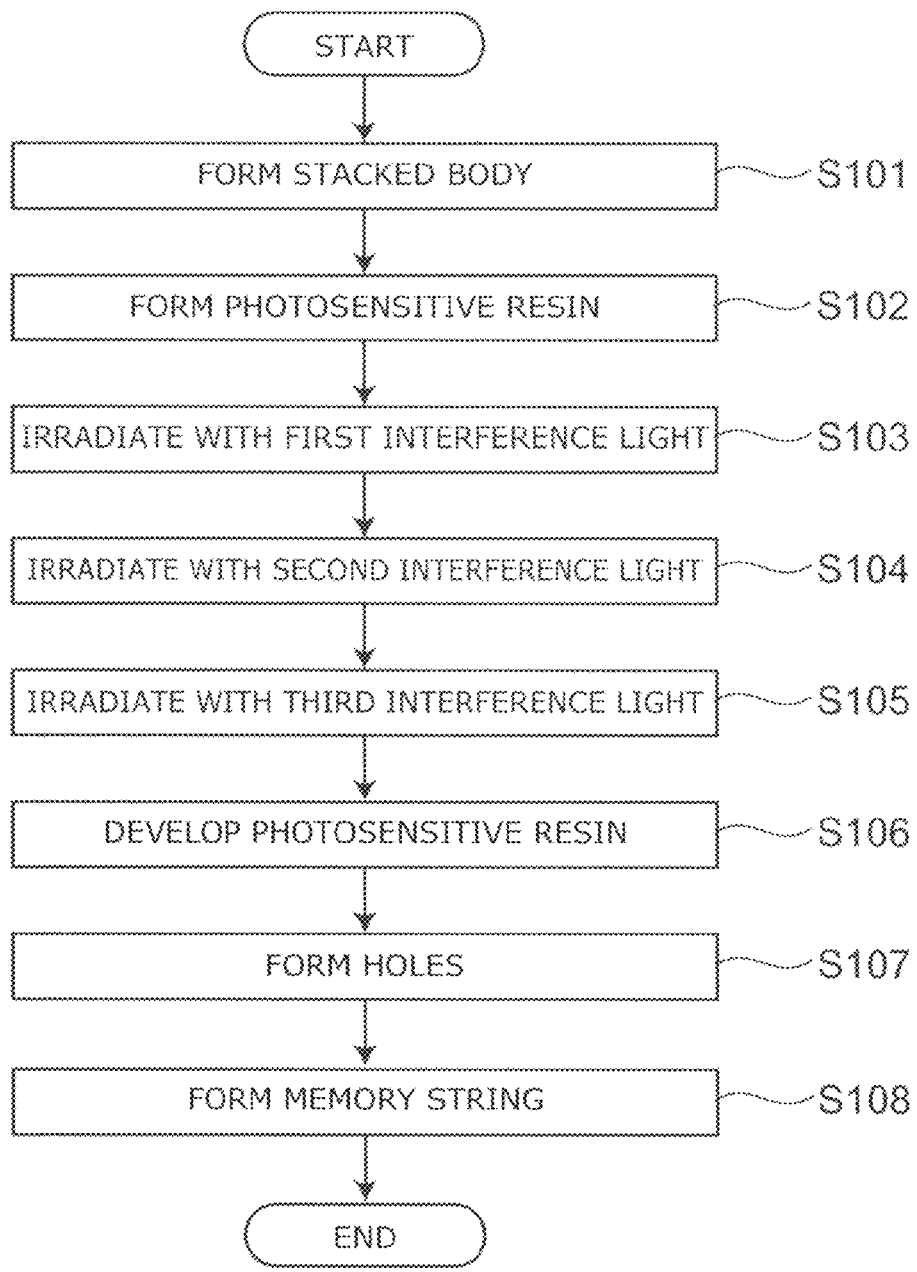
FIG. 6 is a flowchart illustrating a method for manufacturing the semiconductor memory device according to the second embodiment.

FIG. 6 is a flowchart illustrating a method for manufacturing the semiconductor memory device according to the second embodiment.

As shown in FIG. 6, the method for manufacturing the semiconductor memory device according to this embodiment includes: forming a stacked body (step S101); forming photosensitive resin (step S102); irradiating with a first interference light (step S103); irradiating with a second interference light (step S104); irradiating with a third interference light (step S105); developing the photosensitive resin (step S106); forming holes (step S107); and forming a memory string (step S108).

In forming the stacked body in step S101, a process of forming the stacked body 20 on the first face 11a of the substrate 11 is carried out. The stacked body 20 includes the plurality of electrode films 21 and the plurality of insulating films 22 stacked alternately.

In the process of forming the stacked body 20, the concave portions 15 may be formed in the substrate 11 and the connecting member 40 may be formed within the concave portions 15, before forming the stacked body 20.

In forming the photosensitive resin in step S102, a resist made from the photosensitive resin is formed on the stacked body 20. The resist is formed to a uniform thickness on the stacked body 20 by, for example, rotation application.

In irradiating with the first interference light in step S103, the first interference light that has a plurality of first interference fringes irradiates the resist.

Figure 7:
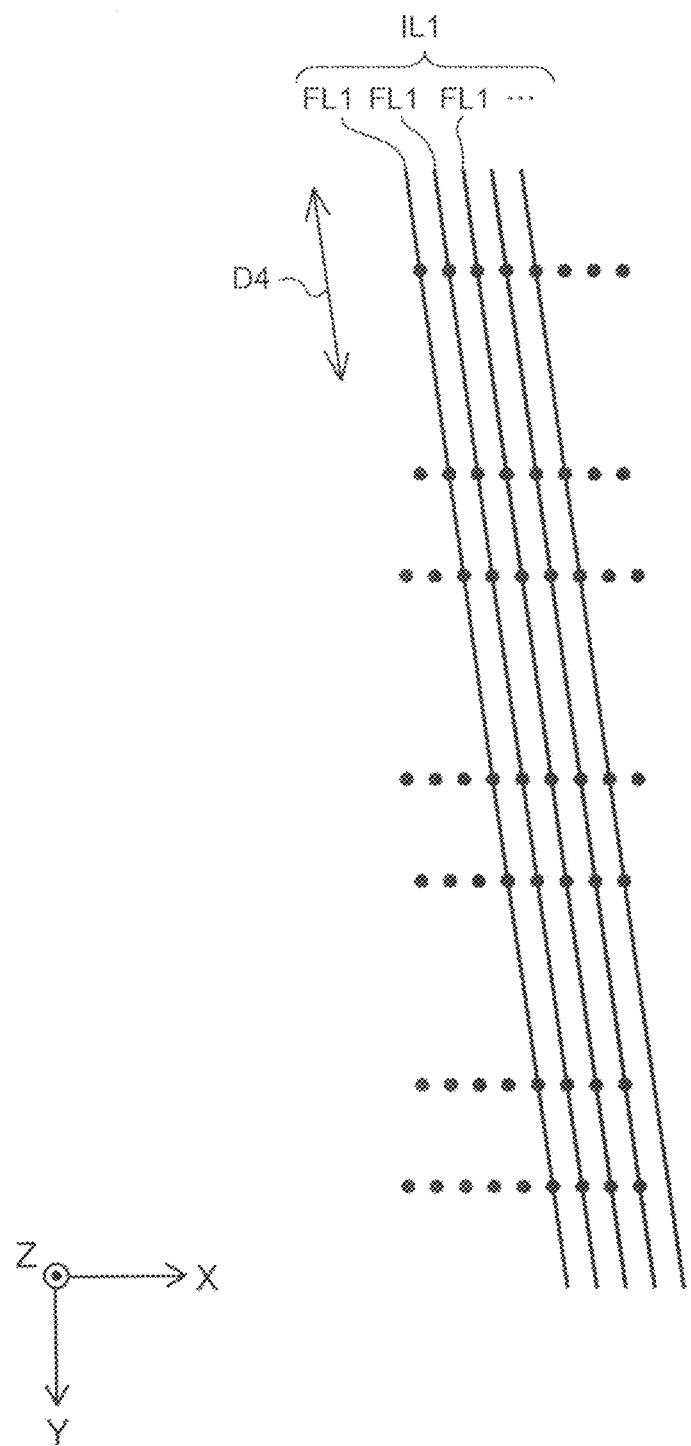
FIG. 7 schematically illustrates the first interference light.

FIG. 7 schematically illustrates the first interference light.

In FIG. 7, the irradiation positions of the first interference light IL1 are illustrated when viewed from the Z direction. For convenience of explanation, in addition to the first interference light IL1, FIG. 7 also indicates the positions where the plurality of semiconductor pillars SP are to be formed using circle symbols.

The first interference light IL1 includes a plurality of mutually parallel first interference fringes FL1. The plurality of interference fringes FL1 extends in a fourth direction D4. The fourth direction D4 is a direction perpendicular to the Z direction, and not parallel to the X direction and the Y direction. The plurality of first interference fringes FL1 extends linearly in the fourth direction D4.

If the photosensitive resin is a negative-type resist, the first interference fringes FL1 are the dark portions of the interference light that has bright and dark portions. If the photosensitive resin is a positive-type resist, the first interference fringes FL1 are the bright portions of the interference light that has bright and dark portions.

In irradiating with the second interference light in step S104, the second interference light that has a plurality of second interference fringes irradiates the resist.

Figure 8:
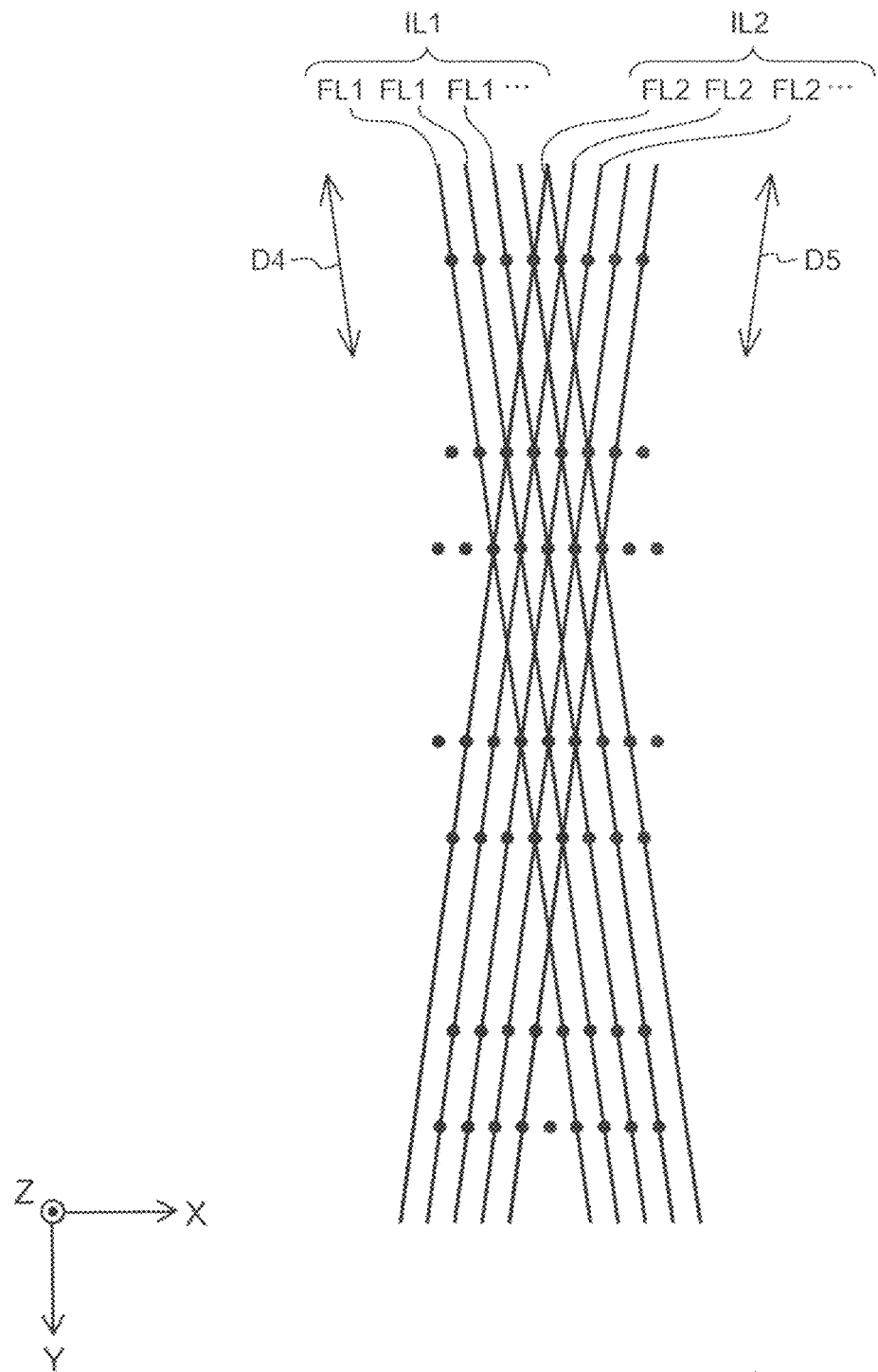
FIG. 8 schematically illustrates the second interference light.

FIG. 8 schematically illustrates the second interference light.

In FIG. 8, the irradiation positions of the second interference light IL2 are illustrated when viewed from the Z direction. For convenience of explanation, in addition to the first interference light IL1 and the second interference light IL2, FIG. 8 also indicates the positions where the plurality of semiconductor pillars SP are to be formed using circle symbols.

The second interference light IL2 includes a plurality of mutually parallel second interference fringes FL2. The plurality of second interference fringes FL2 extends in a fifth direction D5. The fifth direction D5 is a direction perpendicular to the Z direction, and not parallel to the X direction, the Y direction, and the fourth direction D4. The plurality of second interference fringes FL2 extends linearly in the fifth direction D5.

The shape of the second interference fringes FL2 of the second interference light IL2, and the shape of the first interference fringes FL1 of the first interference light IL1 are linearly symmetrical to each other about the Y axis as center.

If the photosensitive resin is a negative-type resist, the second interference fringes FL2 are the dark portions of the interference light that has bright and dark portions. If the photosensitive resin is a positive-type resist, the second interference fringes FL2 are the bright portions of the interference light that has bright and dark portions.

In irradiating with the third interference light in step S105, the third interference light that has a plurality of third interference fringes irradiates the resist.

Figure 9:
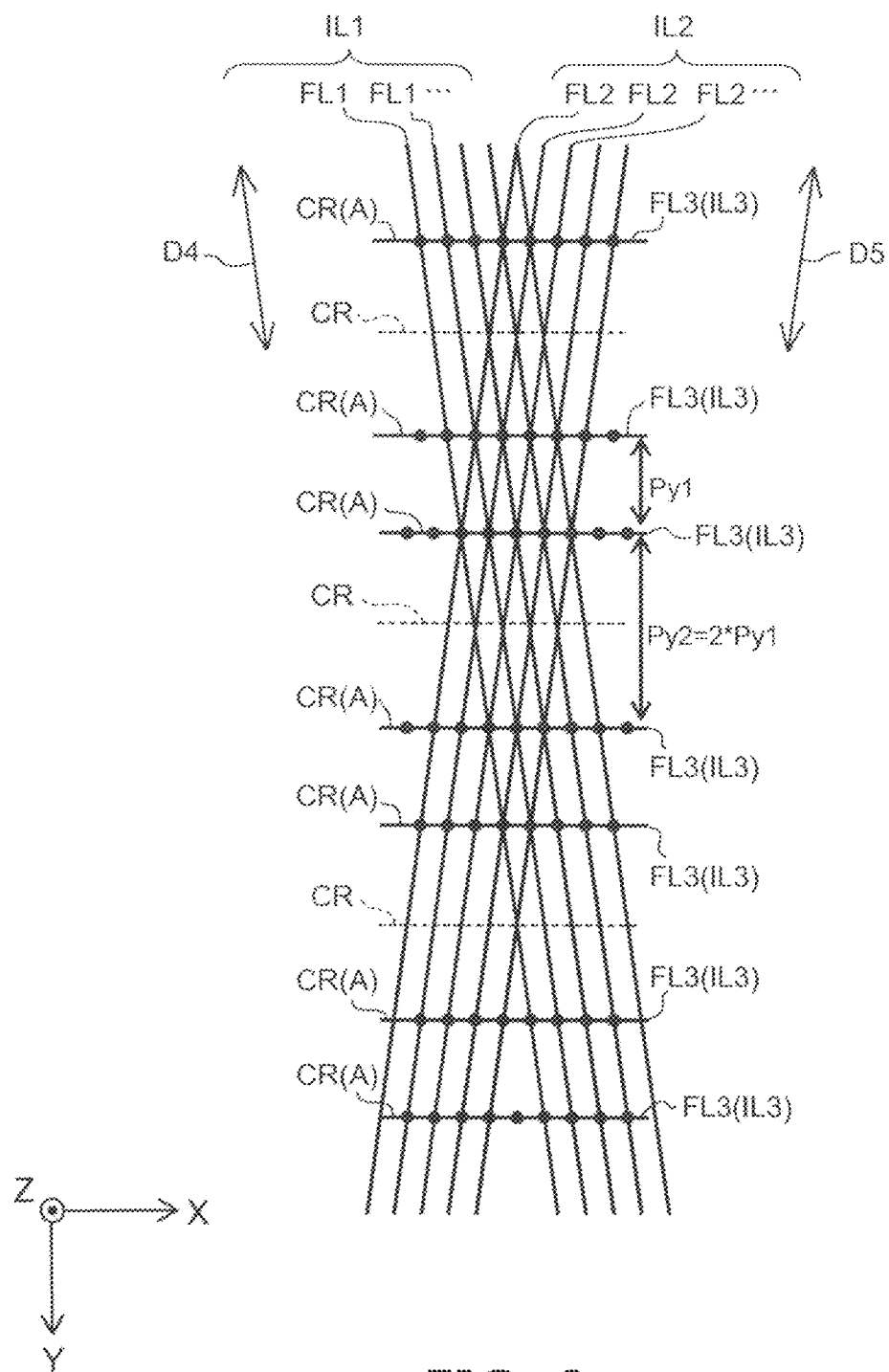
FIG. 9 schematically illustrates the third interference light.

FIG. 9 schematically illustrates the third interference light.

In FIG. 9, the irradiation positions of the third interference light IL3 are illustrated when viewed from the Z direction. For convenience of explanation, in addition to the first interference light IL1, the second interference light IL2, and the third interference light IL3, FIG. 9 indicates the positions where the plurality of semiconductor pillars SP are to be formed using circle symbols.

The third interference light IL3 includes a plurality of mutually parallel third interference fringes FL3. The plurality of third interference fringes FL3 extends in the X direction. The third interference fringes FL3 irradiate straight lines that connect the plurality of intersection positions CR where the plurality of first interference fringes FL1 and the plurality of second interference fringes FL2 intersect.

If the photosensitive resin is a negative-type resist, the third interference fringes FL3 are the dark portions of the interference light that has bright and dark portions. If the photosensitive resin is a positive-type resist, the third interference fringes FL3 are the bright portions of the interference light that has bright and dark portions.

In the example shown in FIG. 9, the interval in the Y direction of the plurality of third interference fringes FL3 is the first interval Py1 and the second interval Py2 which is double the first interval Py1 repeated alternately.

In other words, the plurality of intersection positions CR where the plurality of first interference fringes FL1 and the plurality of second interference fringes FL2 intersect are repeated at the first interval Py1 in the Y direction. In the example illustrated in FIG. 9, among the intersection positions CR repeated at the first interval Py1, one in every three is omitted and the remaining intersection positions CR (A) are irradiated by the third interference fringes FL3 of the third interference light IL3.

In this way, at the positions where the first interference fringes FL1, the second interference fringes FL2, and the third interference fringes FL3 are superimposed, multiple light exposure is carried out.

In developing the photosensitive resin in step S106, the photosensitive resin is developed to form a plurality of apertures. In developing the photosensitive resin, apertures are formed at the positions where multiple light exposure was carried out previously.

In forming the holes in step S107, the stacked body 20 is etched via the plurality of apertures in the photosensitive resin. In this way, the plurality of holes (through holes TH) that penetrates the stacked body 20 in the Z direction is formed.

In forming the memory string in step S108, the plurality of semiconductor pillars SP is formed by embedding the memory film MF and the semiconductor layer 39 in each of the plurality of holes (through holes TH). In this way, the semiconductor memory device 110 is completed.

According to this manufacturing method, each of the plurality of semiconductor pillars SP is disposed at the nodes of a honeycomb shape when viewed from the Z direction. Also, when the plurality of semiconductor pillars SP is projected on the ZY plane, the memory array region Rm is formed with the component in the Y direction of the interval of the plurality of semiconductor pillars SP repeating alternately at the first interval Py1 and the second interval Py2 which is double the first interval Py1.

In this layout of the plurality of semiconductor pillars SP, both the plurality of first interference fringes FL1 of the first interference light IL1 and the plurality of second interference fringes FL2 of the second interference light IL2 can be formed as straight lines. Therefore, the interference light is easily generated.

Figure 10:
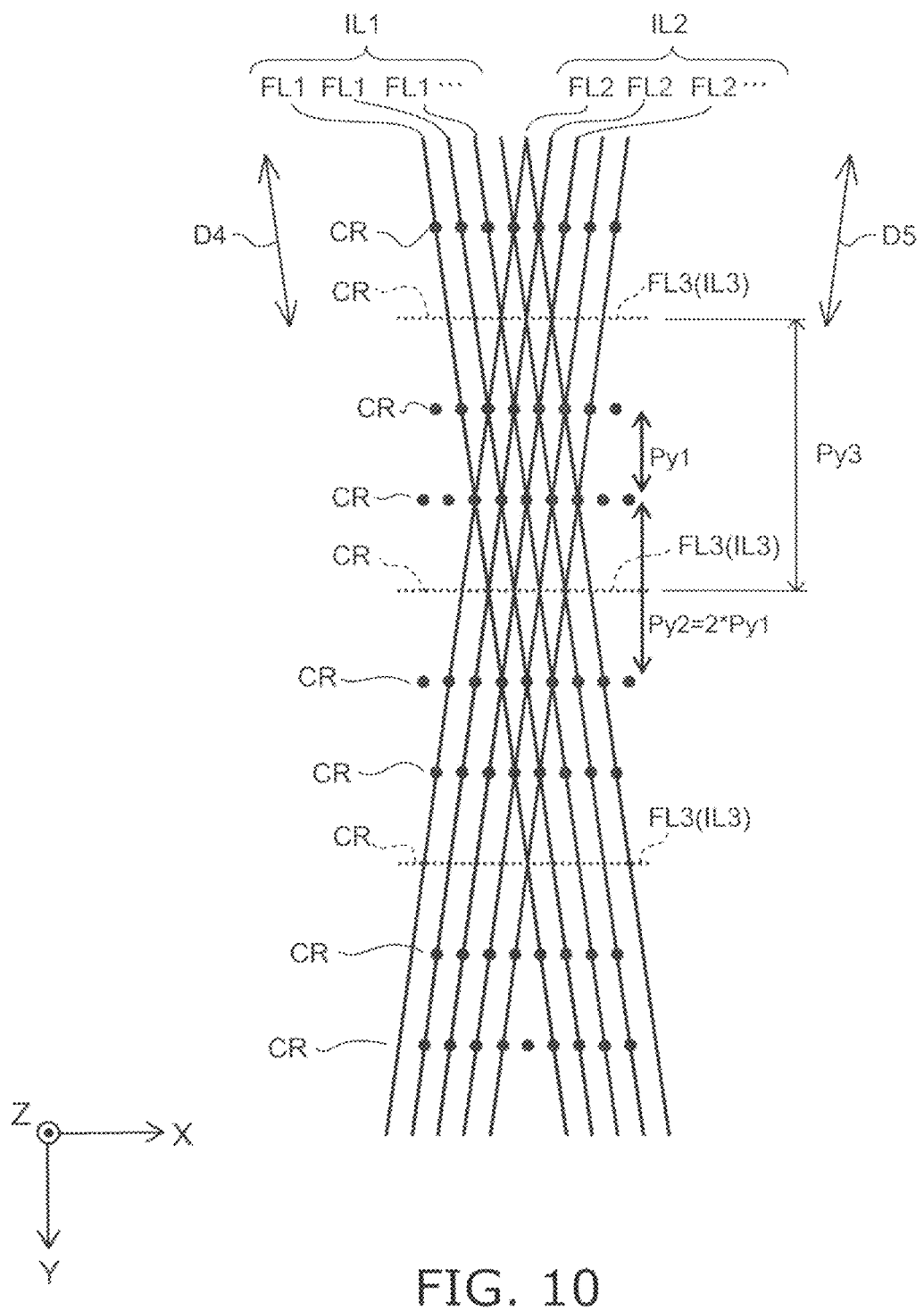
FIG. 10 is a schematic view illustrating another multiple light exposure scheme.

FIG. 10 is a schematic view illustrating another multiple light exposure scheme.

In FIG. 10, the irradiation positions of the third interference light IL3 are illustrated when viewed from the Z direction. In the example shown in FIG. 10, the bright and dark in the third interference fringes FL3 of the third interference light IL3 is the opposite to the bright and dark in the first interference fringes FL1 of the first interference light IL1 and the second interference fringes FL2 of the second interference light IL2.

For example, if the photosensitive resin is a negative-type resist, the first interference fringes FL1 and the second interference fringes FL2 are dark portions, and the third interference fringes FL3 are bright portions. On the other hand, if the photosensitive resin is a positive-type resist, the first interference fringes FL1 and the second interference fringes FL2 are bright portions, and the third interference fringes FL3 are dark portions.

As shown in FIG. 10, in this multiple light exposure, the third interference fringes FL3 irradiate lines that connect the plurality of intersection positions CR where the plurality of first interference fringes FL1 and the plurality of second interference fringes FL2 intersect. The interval in the Y direction of the plurality of third interference fringes FL3 is a constant third interval Py3. The third interval Py3 is the sum of the first interval Py1 and the second interval Px2. The third interference fringes FL3 irradiate the positions where the semiconductor pillars SP are not formed, from among the intersection positions CR.

As described previously, the bright and dark in the third interference fringes FL3 are the opposite to the bright and dark in the first interference fringes FL1 and the second interference fringes FL2. Therefore, among the intersection positions CR, at the positions where the semiconductor pillars SP are formed, multiple light exposure is carried out due to the three interference lights: the first interference light IL1 the second interference light IL2, and the third interference light IL3. On the other hand, among the intersection positions CR, at the positions where the semiconductor pillars SP are not formed, multiple light exposure is only carried out due to the two interference lights, the first interference light IL1 and the second interference light IL2, from among the first interference light IL1 the second interference light IL2, and the third interference light IL3.

Therefore, when the photosensitive resin is developed after multiple light exposure, apertures are formed only at the intersection positions CR where multiple light exposure has been carried out three times.

In the multiple light exposure shown in FIG. 10, the interval Py3 in the Y direction of the plurality of interference fringes FL3 of the third interference light IL3 is constant. Therefore, the lithography margin becomes larger compared with a case in which the intervals in the Y direction of the plurality of interference fringes FL3 are not equal.

In the manufacturing method of the semiconductor memory device 110 according to this embodiment, multiple light exposure is carried out three times as the light exposure for the photosensitive resin for forming the through holes TH for forming the semiconductor pillars SP. With multiple light exposure three times, high contrast light exposure is achieved.

Figure 11:
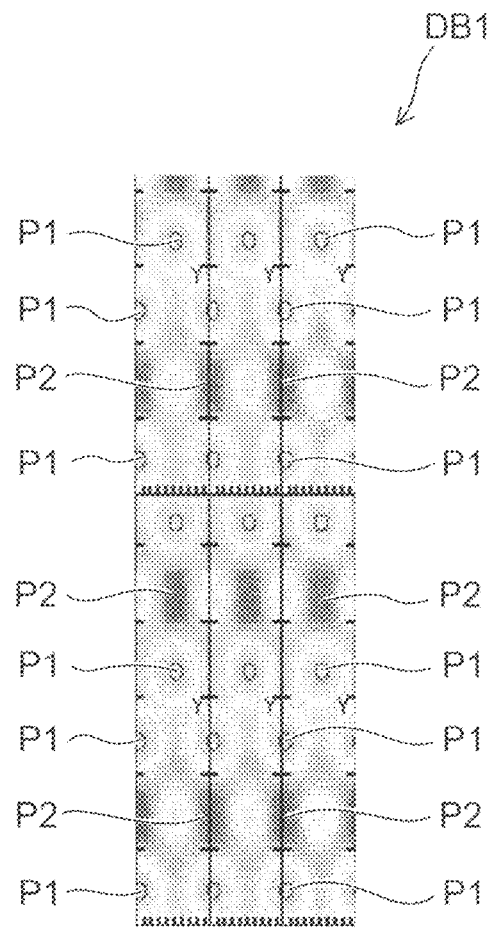
FIG. 11 illustrates the distribution of light intensity for multiple light exposure three times.

FIG. 11 illustrates the distribution of light intensity for multiple light exposure three times.

Figure 12:
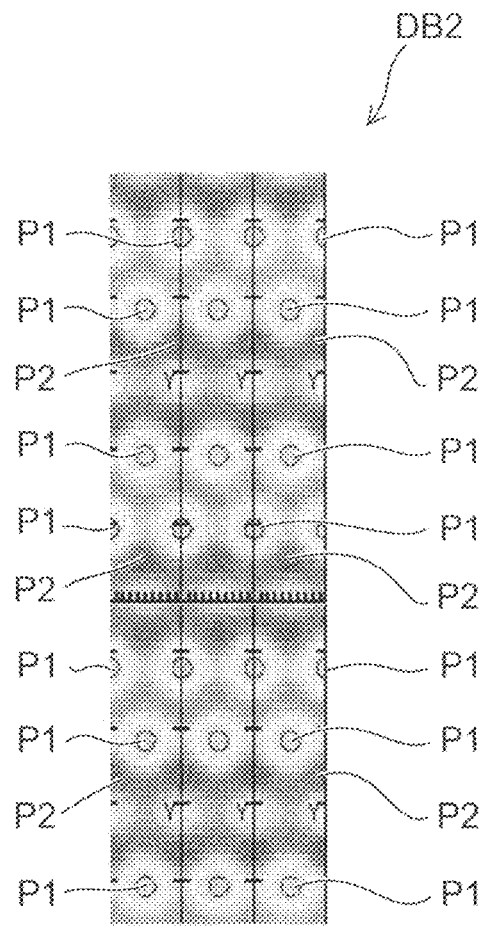
FIG. 12 illustrates the distribution of light intensity for light exposure one time.

FIG. 12 illustrates the distribution of light intensity for light exposure one time.

The distributions of light intensity DB1 and DB2 shown in FIG. 11 and FIG. 12 are the results of simulation calculations for the distribution of light intensity for a case in which a photosensitive resin that is a negative-type resist is used. Because a negative-type resist is used, the light intensity is a minimum at the positions P1 where the apertures are formed. Also, the positions P2 are positions where the light intensity is a maximum.

The contrast for each of the distributions of light intensity DB1 and DB2 shown in FIG. 11 and FIG. 12 was found. The contrast was found from the following equation.

Contrast=($I$max−$I$min)/($I$max+$I$min)

Here, Imax is the maximum light intensity (the light intensity at the position P2), and Imin is the minimum light intensity (the light intensity at the position P1).

In the distribution of light intensity DB1 for multiple light exposure three times as shown in FIG. 11, the contrast is 0.43. In the distribution of light intensity DB2 for light exposure one time as shown in FIG. 12, the contrast is 0.38. In other words, the contrast is higher for multiple light exposure three times than for light exposure one time.

(Variation)

Figure 13:
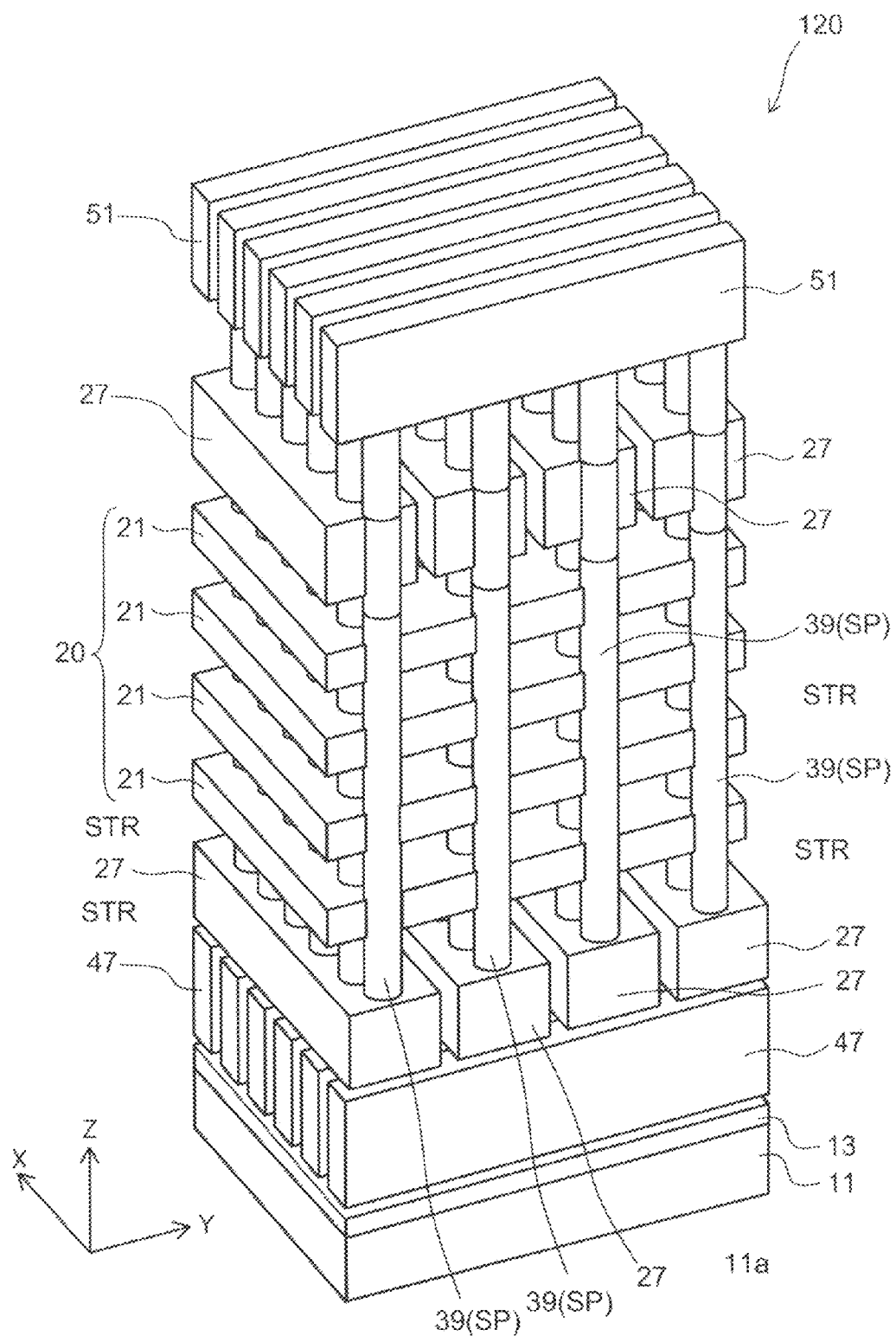
FIG. 13 is a schematic perspective view illustrating the configuration of a semiconductor memory device according to a variation.

FIG. 13 is a schematic perspective view illustrating the configuration of a semiconductor memory device according to a variation.

As shown in FIG. 13, in a semiconductor memory device 120, the connecting member 40 is not provided, and each of the semiconductor pillars SP is independent. In other words, in the semiconductor memory device 120, linear memory strings STR2 are provided.

In the semiconductor memory device 120, the control electrodes 27 are provided both on the top side and bottom side of the stacked body 20. A control electrode 27 is provided for each of the plurality of semiconductor pillars SP aligned along the X axis. The plurality of source lines 47 is provided between the bottom side control electrode 27 and the substrate 11, each extending along the Y axis. The plurality of bit lines 51 is provided above the top side control electrode 27, each extending along the X axis.

In this semiconductor memory device 120 also, each of the plurality of semiconductor pillars SP is disposed at the node of a honeycomb shape when viewed from the Z direction. Also, when the plurality of semiconductor pillars SP is projected onto the ZY plane, the intervals in the Y direction are the first interval Py1 and the second interval Py2 repeating alternately.

According to the semiconductor memory device according to this embodiment and the method for manufacturing the same as described above, it is possible to increase the density of memory cells, as well as achieving a narrower pitch for interconnection such as the bit line and the like.

Note also that although embodiments and variations have been described above, the present invention is not limited to these. For example, configurations of the above described embodiments or variations which have been added to, removed from, or changed in design in a way that could be easily arrived at by a person skilled in the art, and any appropriate combination of the characteristics of the embodiments is to be construed as being within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a semiconductor substrate having a first face; and
a memory array region provided on the first face of the semiconductor substrate, and including a plurality of semiconductor pillars extending in a first direction perpendicular to the first face,
the memory array region including a plurality of memory cells connected in series,
each of the semiconductor pillars being disposed at the nodes of a honeycomb shape when viewed in the first direction, and
when the semiconductor pillars are projected onto a first plane along the first direction and a second direction perpendicular to the first direction, a component in the second direction of an interval between the semiconductor pillars having a first interval and a second interval repeated alternately, the second interval being an integer multiple of the first interval greater than or equal to 2.

2. The device according to claim 1, wherein the semiconductor pillars are disposed at an equal interval in a third direction perpendicular to the first direction and the second direction.

3. The device according to claim 1, wherein the semiconductor pillars includes
a first semiconductor pillar, and
a second semiconductor pillar disposed at the second interval from the first semiconductor pillar in the second direction,
the device further includes a connecting portion connecting an end portion on a side of the semiconductor substrate of the first semiconductor pillar, and an end portion on a side of the semiconductor substrate of the second semiconductor pillar.

4. The device according to claim 1, wherein the memory array region includes:
a plurality of electrode films stacked in the first direction;
a semiconductor film extending in the first direction, the semiconductor film being included in the each of the semiconductor pillars; and
a memory film provided between the semiconductor film and each of the electrode films.

5. The device according to claim 1, further comprising a plurality of first interconnections extending in the second direction,
an interval of the first interconnections in a third direction perpendicular to the first direction and the second direction being half an interval in the third direction of the semiconductor pillars.

6. The device according to claim 5, further comprising a plurality of second interconnections perpendicular to the first interconnections.

7. A semiconductor memory device, comprising:
a semiconductor substrate having a first face, the first face being along a second direction and a third direction perpendicular to a first direction; and
a plurality of pillars provided on the first face, the pillars extending in the first direction perpendicular to the first face, the pillars being included in a plurality of memory cells, the memory cells connected in series, end portions of the pillars being in contact with interconnections, the end portions being disposed on an opposite side of a side of the semiconductor substrate,
six pillars of the pillars being disposed at vertices of hexagonal pattern as viewed from the first direction,
three pairs of two pillars in the six pillars being alternately arranged in the third direction, and two pairs of two pillars in the six pillars being alternately arranged in the second direction,
any one of the pillars connected to interconnections not being disposed inside the hexagonal pattern,
as viewed from the third direction, intervals of the pillars in the second direction having a first interval and a second interval, the second interval being greater than or equal to double of the first interval.

8. The device according to claim 7, wherein intervals in the third direction between the pillars are the same as viewed from the second direction.

* * * * *